United States Patent
Katoch et al.

(10) Patent No.: US 8,681,576 B2
(45) Date of Patent: Mar. 25, 2014

(54) PRE-CHARGE AND EQUALIZATION DEVICES

(75) Inventors: Atul Katoch, Kanata (CA); Arun Achyuthan, Ontario (CA); Cormac Michael O'Connell, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 240 days.

(21) Appl. No.: 13/118,956

(22) Filed: May 31, 2011

(65) Prior Publication Data

US 2012/0307580 A1 Dec. 6, 2012

(51) Int. Cl.
*G11C 7/00* (2006.01)

(52) U.S. Cl.
USPC .......................................................... 365/203

(58) Field of Classification Search
USPC .......................................................... 365/203
See application file for complete search history.

(56) References Cited

U.S. PATENT DOCUMENTS

| 6,452,859 B1 * | 9/2002 | Shimano et al. ......... 365/230.06 |
| 2009/0116309 A1 * | 5/2009 | Hanzawa et al. ........ 365/189.15 |

* cited by examiner

*Primary Examiner* — Anthan Tran
(74) *Attorney, Agent, or Firm* — Lowe Hauptman & Ham, LLP

(57) ABSTRACT

A circuit comprises a set of pre-charge and equalization devices, a control signal line, and a word line. The set of pre-charge and equalization devices is configured to pre-charge and equalize a pair of data lines. The control signal line is configured to control the pre-charge and equalization devices. The word line is configured to electrically couple a memory cell to a data line of the pair of data lines. A first voltage value provided to the control signal line is from a first voltage source different from a second voltage source that generates a second voltage value for the word line.

15 Claims, 2 Drawing Sheets

PRE-CHARGE AND EQUALIZATION DEVICES

FIELD

The present disclosure is related to pre-charge and equalization devices.

BACKGROUND

Generally, before reading data in a memory cell in a dynamic random access memory (DRAM), a pair of bit lines is charged and equalized to a predetermined voltage value by pre-charge and equalization devices. The term "pre-charge" instead of "charge" is commonly used to indicate that charging the bit lines is prior to reading the memory cell. The value of the pre-charge and equalization voltage varies depending on the architecture of the DRAM. Examples of the pre-charge and equalization voltage values include reference voltage value VSS, operational voltage value VDD, voltage value VDD/2, etc. In some approaches, a supply voltage value VPP much higher than operational voltage value VDD is used to power the pre-charge and equalization devices so that sufficient voltage values for the pre-charge and equalization voltage is maintained. Otherwise, reading could result in inaccurate data. In some approaches, voltage VPP is provided by a supply voltage source used to activate the word line. Because of the high voltage value VPP, the power consumed by the pre-charge and equalization devices is high. Additionally, the pre-charge and equalization devices are designed so that the gate dielectric or gate oxide is thicker than that of a regular device to withstand the higher voltage value VPP. As the gate oxide becomes thicker, the size of the pre-charge and equalization devices becomes bigger, and the pre-charge and equalization devices run at a slower speed.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
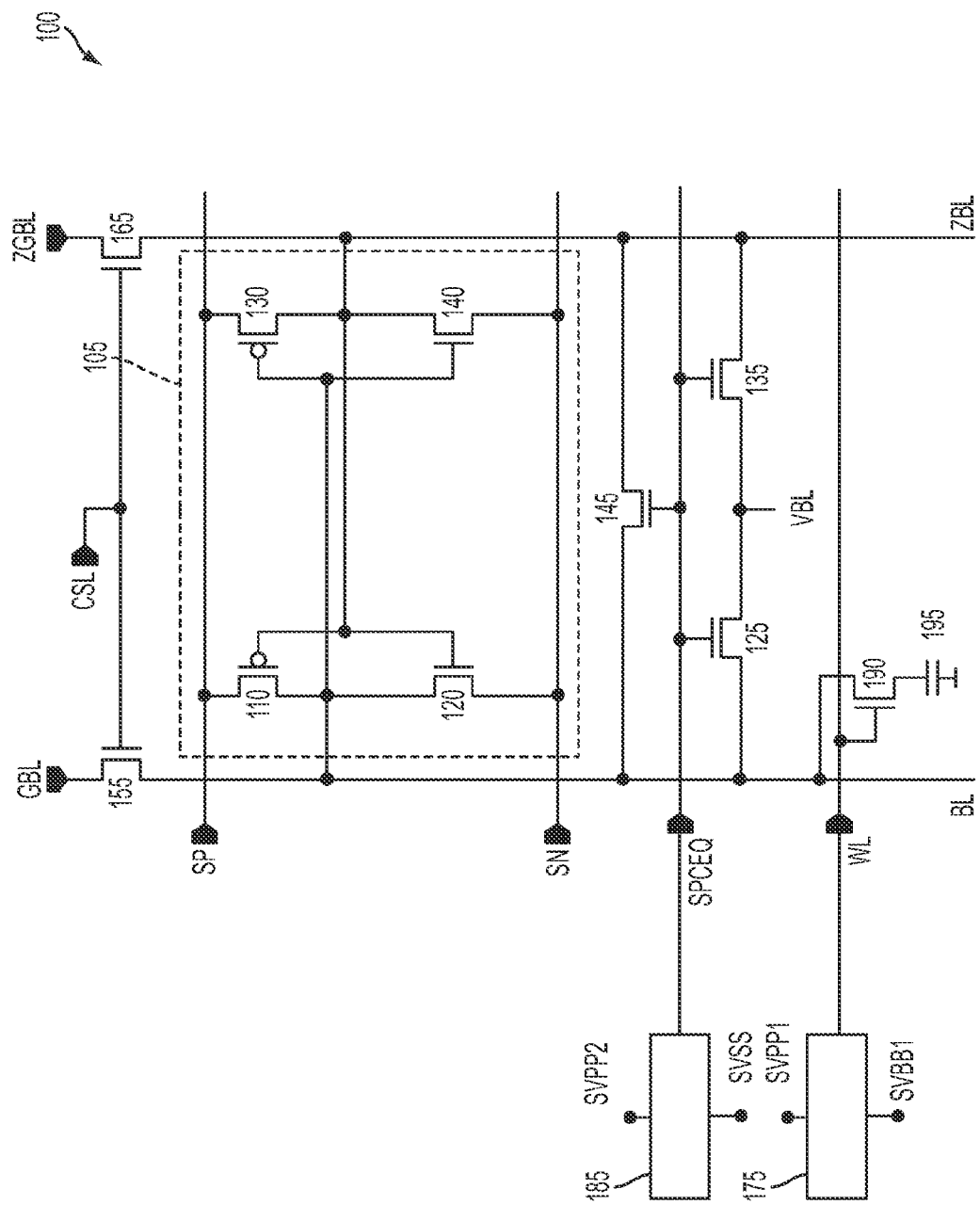
FIG. 1 is a diagram of a circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. A supply voltage value VPP2 from a supply voltage source SVPP2 is used to generate a high voltage value to turn on pre-charge and equalization devices. Voltage value VPP2 is lower than voltage value VPP1 used for the word line, but is sufficient to pre-charge and equalize the bit lines. As a result, "regular" devices having regular gate oxide thickness, instead of thick oxide devices, are used as pre-charge and equalization devices. In various embodiments, as voltage value VPP2 is lower than voltage value VPP1, the power consumed by the pre-charge and equalization devices is reduced, resulting in significant power saving because the bit line pre-charge and equalization generally consumes significant power in an eDRAM. The pre-charge and equalization devices are subject to an acceptable stress level as voltage VGS dropped across the gate and the source of the pre-charge and equalization devices is within an acceptable range.

Exemplary Circuit

FIG. 1 is a diagram of a circuit 100 illustrating an operation of a memory cell 195, in accordance with some embodiments. Transistor 190 allows access between sense amplifier 105 and memory cell 195 through a pair of bit lines BL and ZBL. In some embodiments, bit lines BL and ZBL are connected to an equal number of memory cells, but only one transistor 190 and one capacitor functioning as a memory cell 195 are shown for illustration.

In some embodiments, memory cell 195 is a capacitor storing charge. When memory cell 195 is electrically connected to a bit line BL as shown in FIG. 1, memory cell 195 shares the same charge with bit line BL. Depending on the charge indicating the logic value of memory cell 195, bit line BL is pulled one way or another. For example, if memory cell 195 stores a low logic value (Low), bit line BL is pulled towards ground. Conversely, if memory cell 195 stores a high logic value (High), bit line BL is pulled towards operational voltage VDD. After sharing the charge, the voltage difference between bit line BL and bit line ZBL, commonly called a bit line split, starts to develop.

Bit lines BL and ZBL serve as both data input and output (TO) for sense amplifier 105. Generally, except when being pre-charged and equalized, bit lines BL and ZBL are of the opposite logic value of one another. In a write cycle, applying a logic value to a first bit line, and the opposite logic value to the other bit line, enables writing the logic value at the first bit line to memory cell 195.

In a read cycle, sensing or reading the logic values at bit lines BL and ZBL reveals the data stored in memory cell 195. For example, if memory cell 195 stores a High, then sensing bit line BL reveals a High. Conversely, if memory cell 195 stores a Low then sensing bit line BL reveals a Low. When there is a bit line split between bit lines BL and ZBL, then there is a difference in voltage VGS of transistors 110 and 120 as compared to VGS of transistors 130 and 140 (where voltage VGS is the voltage from a gate to a source of a transistor). Sense amplifier 105 senses or amplifies this voltage difference.

Column select signal CSL and transistors 155 and 165 enable the data transfer between bit lines BL and ZBL, and global bit lines GBL and ZGBL, respectively.

Signals SP and SN are used to turn on or off sense amplifier 105. Signal SP is commonly called the positive voltage supply while signal SN is commonly called the negative voltage supply, even though signal SN has a positive voltage in many situations. In some embodiments, when signals SP and SN and bit lines BL and ZBL are at a same level, amplifier 105 is off. But when signal SP is at voltage VDD and signal SN is at ground level or voltage VSS, sense amplifier 105 is on.

Sense amplifier 105 includes transistors 110, 120, 130, and 140. A pair of PMOS transistors (110 and 130), and a pair of NMOS transistors (120 and 140) form the sensing pairs for sense amplifier 105.

Voltage source SVPP1 is used to provide the high voltage value VPP1 (not labeled) for word line driver 175. Voltage source SVBB1 is used to provide the low voltage value VBB1 (not labeled) for word line driver 175. Word line driver 175 generates the voltage values for word line WL based on voltage values VPP1 and VBB1. In some embodiments, the high voltage value for word line WL is voltage value VPP1 and the low voltage value for word line WL is voltage value VBB1.

Word line WL is used to turn on or off transistor 190 to allow access to memory cell 195 through transistor 190. In the example of FIG. 1, transistor 190 and memory cell 195 are electrically coupled to bit line BL for illustration. Depending on implementations in a memory array, some memory cells are connected to bit line BL while some other memory cells are connected to bit line ZBL. When word line WL at the gate of transistor 190 is applied with a Low, transistor 190 is turned off. Memory cell 195 is therefore electrically disconnected from bit line BL or from sense amplifier 105. When word line WL is applied with a High, however, transistor 190 is turned on and memory cell 195 is electrically connected to a bit line BL. In some embodiments, the high voltage level VPP1 of word line WL is about 1.3 timesVDD, and the low voltage level VBB1 of word line WL is about −0.45V.

Signal SPCEQ and transistors 125, 135, and 145 are used to pre-charge and equalize bit lines BL and ZBL. The voltage value of signal SPCEQ is called voltage VPCEQ. Transistors 125, 135, and 145 are called pre-charge and equalization devices PCEQ. In some embodiments, the drain and the source of each transistor 125, 135, and 145 are used interchangeably. Depending on the voltage value at a first terminal, such as a High, the first terminal serves as a drain while the second terminal serves as a source. But when the first terminal has a Low, the first terminal serves as a source and the second terminal serves as a drain.

Transistor 145 is coupled between bit lines BL and ZBL. Transistors 125 and 135 are coupled in series between bit lines BL and ZBL. When signal SPCEQ is applied with a High, transistors 125, 135, and 145 are turned on allowing bit lines BL and ZBL to be at the same voltage level VBL at the drains of transistors 125 and 135. Stated differently, bit lines BL and ZBL are pre-charged and equalized to voltage VBL. In some embodiments, voltage VBL is about 40% of operational voltage VDD. In some embodiments, transistors 125, 135, and 145 are regular device like transistors 110, 120, 130, 140, 155, 165, which is different from other approaches. In those approaches, the gates of transistors 125, 135, and 145 receive high voltage VPP1, and transistors 125, 135, and 145 have thicker gate oxide to withstand the high voltage VPP1. In contrast, in various embodiments, the gate oxide of each transistor 125, 135, 145, 110, 120, 130, 140, 155, 165 has the same thickness. The threshold voltage of each transistor 125, 135, and 145 is called voltage Vtn.

Voltage source SVPP2 is used to provide the high voltage value VPP2 (not labeled) for pre-charge and equalization driver 185. Voltage source SVSS is used to provide the low voltage value VSS (not labeled) for driver 185. Driver 185 generates the voltage values for signal SPCEQ based on voltage values VPP2 and VSS. In some embodiments, the high voltage value for signal SPCEQ is voltage value VPP2 and the low voltage value for signal SPCEQ is voltage value VSS. Voltage source SVPP2 for driver 185 is distinct from voltage source SVPP1 used for word line driver 185. In some embodiments, voltage value VPP2 is about 1.2 V while voltage value VPP1 is about 1.5 V.

In some embodiments, voltage value VPP2 is chosen such that voltage value VPP2 or the high voltage value of voltage VPCEQ is greater than threshold voltage Vtn of transistors 125, 135, and 145 plus voltage value VBL and a margin voltage Vm. That is $$VPCEQ > Vtn + VBL + Vm \qquad (1)$$

Margin voltage Vm is to cover variations in manufacturing process, operational voltage, and temperature. For simplicity, margin voltage Vm is not a part of the following equations.

Voltage value VPP2 is also chosen so that the high voltage value of voltage VPCEQ is less than voltage VBL plus a reliability voltage limit Vr. That is, $$VPCEQ < VBL + Vr \qquad (2)$$

Reliability voltage limit Vr is determined and varies depending on the technology nodes, such as 65 nm, 40, nm, 28 nm, etc.

In some embodiments, $$Vr = K * Tox \qquad (3)$$

wherein K is a technology node variable depending on the type of material used for the gate oxide, and thickness Tox is the thickness of the gate oxide of transistors 125, 135, and 145. Those of ordinary skill in the art will recognize that a thinner gate oxide corresponds to a lower value for value thickness Tox. Based on equation (3), a lower value Tox results in a lower reliability voltage Vr. As a result, a lower voltage value VPP2 can be used to generate the high voltage level for signal SPCEQ.

Based on equations (1), (2), and (3)

$$VBL + Vtn < VPCEQ < VBL + Vr$$

$$VBL + Vtn < VPCEQ < VBL + (K * Tox)$$

In some embodiments, VDD is 0.9 V, Vtn is 0.3 V, VBL is (0.4*VDD) or 0.36 V, and Vr is 0.945 V.

Based on equations (1) and (2), voltage VPCEQ and thus voltage VPP2 is in the range of 0.696 V to 1.341 V. Further voltage VGS=VPP2−VBL=1.2 V−0.396 V=0.804 V. Pre-charge and equalization devices 125, 135, and 145 are therefore subject to an acceptable stress level because voltage VGS is in an acceptable range.

Various embodiments are advantageous because voltage source SVPP2 is distinct from voltage source SVPP1 that is used for word line WL. As a result, voltage value VPP2 can be adjusted to generate voltage VPCEQ without affecting the voltage level of word line WL. In some embodiments, because voltage value VPP2 is lower than voltage value VPP1, regular devices instead of thick-oxide devices are used as pre-charge and equalization devices 125, 135, and 145. Because transistors 125, 135, and 145 are regular devices, transistors 125, 135, and 145 consume less power than thick-oxide transistors. Transistors 125, 135, and 145 are subject to smaller spacing rules, resulting in less die area. Transistors 125, 135, and 145 do not require an extra mask such as is used to manufacture the thick oxide in thick-oxide devices.

In the above descriptions, NMOS transistors 125, 135, and 145 are used for illustration. Other types of transistors and corresponding voltage sources used to generate signal SPCEQ to turn on transistors 125, 135, and 145 are within the scope of various embodiments. For example, in some embodiments, PMOS transistors 125', 135', and 145' (not shown) are used in place of NMOS transistors 125, 135, and 145 to pre-charge and equalize bit lines BL and ZBL. The threshold voltage value for PMOS transistors 125', 135', and 145' is called threshold voltage Vtp. Supply voltage sources SVDD and SVBB2 replace voltage sources SVPP2 and SVSS, respectively. Voltage source SVDD generates the high voltage value VDD while voltage source SVBB2 generates the low voltage value VBB2 for signal SPCEQ. In some embodiments, voltage value VBB1 is about-0.45 V while voltage VBB2 is about-0.2V, and voltage value VBB2 is selected such that $$|VBB2|<|VBB1|, \text{ and}$$

$$VBL+|Vtp|<|VBB2-VDD|<Vr+VBL$$

Exemplary Method

Figure 2:
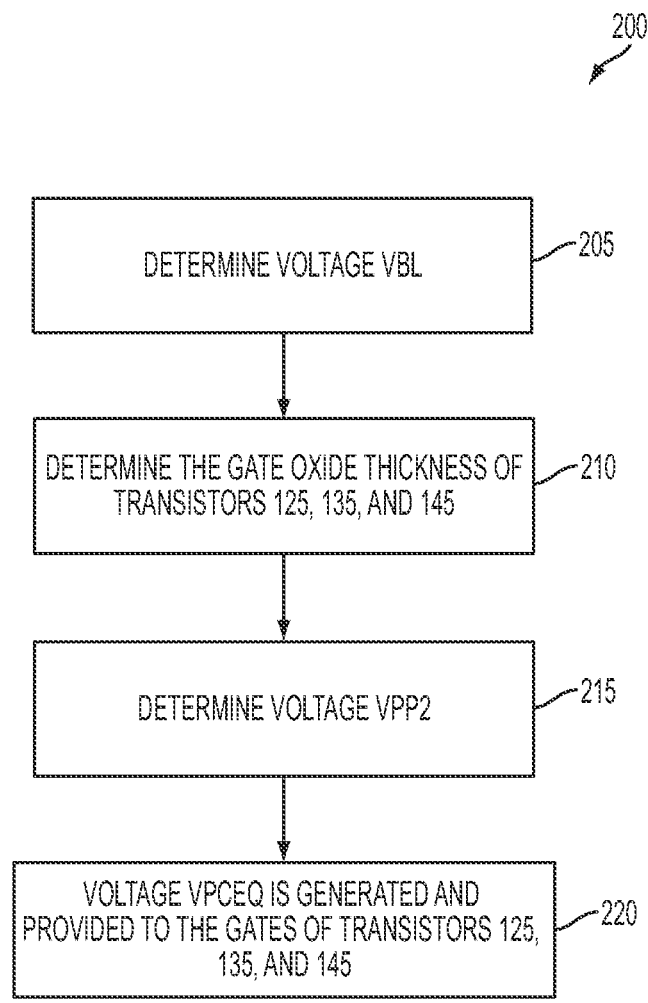
FIG. 2 is a flow chart illustrating an operation of the circuit in FIG. 1, in accordance with some embodiments.

FIG. 2 is a flowchart of a method 200 illustrating an operation of circuit 100, in accordance with some embodiments.

In step 205, pre-charge and equalization voltage value VBL is determined. In some embodiments, voltage VBL is determined based on based on the sensing mechanism, such as VDD sensing, VSS sensing, etc. In some embodiments, VBL is about 42% of voltage VDD.

In step 210, the gate oxide thickness Tox of transistors 125, 135, and 145 is determined. In some embodiments, gate oxide thickness Tox of transistors 125, 135, and 145 is selected among various values available based on a technology node, and is the same as the gate oxide thickness of transistors 110, 120, 130, and 140.

In step 215, voltage VPP2 is determined. In embodiments of NMOS transistors 125, 135, and 145, voltage VPP2 used by driver 185 to generate the high voltage value for signal SPCEQ is selected such that voltage VPP2, and thus the high voltage value of voltage VPCEQ, is less than voltage VPP1. That is, VPP2<VPP1. Further, Vtn+VBL<VPCEQ<(K*Tox)+VBL.

In embodiments of PMOS transistors 125', 135', and 145', voltage VBB2 used by driver 185 to generate the low voltage for signal SPCEQ is selected such that the absolute value of voltage VBB2, and thus the absolute value of the low voltage value of voltage VPCEQ, is less than the absolute value of voltage VBB1. That is, |VBB2|<|VBB1|. Further, |Vtp|+VBL<|VPCEQ-VDD|<(K*Tox)+VBL.

In step 220, voltage VPCEQ is generated and provided to the gates of pre-charge and equalization transistors 125, 135, and 145. As a result, bit lines BL and ZBL are pre-charged and equalized to voltage VBL.

In the above illustration in FIG. 2, transistors 125, 135, and 145 are used. The operation of transistors 125', 135', and 145' should be recognizable of persons of ordinary skill in the art.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

Some embodiments regard a circuit comprising a set of pre-charge and equalization devices, a control signal line, and a word line. The set of pre-charge and equalization devices is configured to pre-charge and equalize a pair of data lines. The control signal line is configured to control the pre-charge and equalization devices. The word line is configured to electrically couple a memory cell to a data line of the pair of data lines. A first voltage value provided to the control signal line is from a first voltage source different from a second voltage source that generates a second voltage value for the word line.

Some embodiments regard a circuit comprising a first transistor, a second transistor, a third transistor, and a first driver. The first transistor has a first terminal, a second terminal, and a first gate. The first terminal is coupled to a first data line. The second terminal is coupled to a second data line. The second transistor has a third terminal, a fourth terminal, and a second gate. The third terminal is coupled to the first data line. The third transistor has a fifth terminal, a sixth terminal, and a third gate. The fourth terminal is coupled to the fifth terminal. The sixth terminal is coupled to the second data line. The first gate, the second gate, and the third gate are coupled together and are configured to receive a control signal line. The first driver is configured to receive a first voltage value and to generate a second voltage value for the control signal line. The first voltage value is provided by a first voltage source different from a second voltage source that provides a third voltage value to a word line. The word line is configured to electrically couple a memory cell to a data line of the pair of data lines.

Some embodiments regard a method. In the method, a pre-charge and equalization voltage value to pre-charge and equalize a pair of data lines is determined. A first gate oxide thickness of pre-charge and equalization devices is determined. The first gate oxide thickness is the same as a second gate oxide thickness of transistors of a sense amplifier coupled to the pair of data lines. A first voltage is provided to cause the pre-charge and equalization devices to pass the pre-charge and equalization voltage value to the pair of data lines. A first high voltage value of the first voltage is less than a second high voltage value of a second voltage used by a word line and Vt+VBL<VPCEQ<(K*Tox)+VBL. Vt represents a threshold voltage of the pre-charge and equalization devices. VBL represents the pre-charge and equalization voltage value. VPCEQ represents the first voltage value. K represents a technology node variable. Tox represents the first gate oxide thickness. VDD represents an operational voltage of the pre-charge and equalization devices. Alternatively, a first absolute value of a first low voltage value of the first voltage is less than a second absolute value of a second low voltage value of the second voltage and Vt+VBL<|VPCEQ-VDD|<(K*Tox)+VBL.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   a set of pre-charge and equalization devices configured to pre-charge and equalize a pair of data lines;
   a control signal line configured to control the pre-charge and equalization devices; and
   a word line configured to electrically couple a memory cell to a data line of the pair of data lines,
   wherein a first voltage value provided to the control signal line is from a first voltage source different from a second voltage source that generates a second voltage value for the word line, and wherein the first voltage source is configured to generate the first voltage value to satisfy at least one of the following conditions:

$$Vt+VBL<VPCEQ<Vr+VBL; \text{ or} \quad (a)$$

$$|Vt|+VBL<|VPCEQ-VDD|<Vr+VBL; \quad (b)$$

VBL represents a pre-charge and equalization voltage value of the pair of data lines:
VDD represents an operational voltage value of the pre-charge and equalization devices;
VPCEQ represents the first voltage value;
Vt represents a threshold voltage of the pre-charge and equalization devices; and
Vr represents a reliability voltage value of the pre-charge and equalization devices, Vr varying depending on a gate oxide thickness of the pre-charge and equalization devices.

2. The circuit of claim 1, wherein
the set of pre-charge and equalization devices include a first transistor, a second transistor, and a third transistor;
gates of the first transistor, the second transistor, and the third transistor are coupled together, and are configured to receive the control signal line;
a first terminal of the first transistor is coupled to a first data line of the pair of data lines, a second terminal of the first transistor is coupled to a second data line of the pair of data lines;
a third terminal of the second device is coupled to the first data line;
a fourth terminal of the second device and a fifth terminal of the third device are coupled together;
a sixth terminal of the third device is coupled to the second data line; and
the fourth terminal and the fifth terminal are configured to receive a voltage value to pre-charge and equalize the pair of data lines.

3. The circuit of claim 2, wherein the first transistor, second transistor, and the third transistor are NMOS transistors, and the first voltage value and the second voltage value are high logic levels.

4. The circuit of claim 2, wherein the first transistor, the second transistor, and the third transistor are PMOS transistors, and the first voltage value and the second voltage value are low logic levels.

5. The circuit of claim 1, wherein a first absolute value of the first voltage value is less than a second absolute value of the second voltage value.

6. The circuit of claim 1, further comprising a sense amplifier coupled to the pair of data lines and having transistors forming a sensing pair, wherein a first gate oxide thickness of the transistors forming the sensing pair is the same as a second gate oxide thickness of transistors of the set of pre-charge and equalization devices.

7. The circuit of claim 1, further comprising a second pair of data lines electrically coupled to the pair of data lines through a pair of transistors.

8. A circuit comprising:
a first transistor having a first terminal, a second terminal, and a first gate; the first terminal coupled to a first data line, the second terminal coupled to a second data line;
a second transistor having a third terminal, a fourth terminal, and a second gate;
the third terminal coupled to the first data line;
a third transistor having a fifth terminal, a sixth terminal, and a third gate; the fourth terminal coupled to the fifth terminal; the sixth terminal coupled to the second data line; the first gate, the second gate, and the third gate coupled together and configured to receive a control signal line; and
a first driver configured to receive a first voltage value and to generate a second voltage value for the control signal line; the first voltage value provided by a first voltage source different from a second voltage source that provides a third voltage value to a word line; the word line configured to cause a memory cell to electrically couple to the first data line or the second data line,
wherein the first voltage source is configured to generate the first voltage value to satisfy at least one of the following conditions:

$$Vt+VBL<VPCEQ<Vr+VBL; \text{ or} \quad (a)$$

$$|Vt|+VBL<|VPCEQ-VDD|<Vr+VBL; \quad (b)$$

VBL represents a pre-charge and equalization voltage value of the first data line and the second data line;
VDD represents an operational voltage value of the first transistor, the second transistor, or the third transistor;
VPCEQ represents the first voltage value;
Vt represents a threshold voltage of the first transistor, the second transistor, or the third transistor; and
Vr represents a reliability voltage value of the first transistor, the second transistor, or the third transistor, Vr varying depending on a gate oxide thickness of the first transistor, the second transistor, or the third transistor.

9. The circuit of claim 8, wherein a first absolute value of the first voltage value is less than a second absolute value of the second voltage value.

10. The circuit of claim 8, wherein the first transistor, the second transistor, and the third transistor are NMOS transistors, and the second voltage value is a high logic value.

11. The circuit of claim 8, wherein the first transistor, the second transistor, and the third transistor are PMOS transistors, and the second voltage value is a low logic value.

12. The circuit of claim 8 further comprising a sense amplifier coupled to the first data line and the second data line and having transistors forming a sensing pair, the transistors forming the sensing pair, and wherein the first transistor, the second transistor, and the third transistor of the circuit have a same gate oxide thickness.

13. A circuit comprising:
a pair of data lines;
an equalization device configured to equalize the pair of data lines responsive to a first control signal;
a first driver configured to generate the first control signal, the first control signal having a first high voltage level and a first low voltage level less than the first high voltage level;
a word line configured to electrically couple a memory cell to one of the pair of data lines responsive to a second control signal; and
a second driver configured to generate the second control signal, the second control signal having a second high voltage level and a second low voltage level less than the second high voltage level, and the first and second drivers being set to satisfy one or more of the following conditions:
(a) the second high voltage level being higher than the first high voltage level; and $$Vt+VBL<VPP<Vr+VBL; \text{ or}$$

(b) the second low voltage level being lower than the first low voltage level; and $$|Vt|+VBL<|VBB-VDD|<Vr+VBL, \text{ wherein}$$

VBL represents a pre-charge and equalization voltage value of the pair of data lines;

VDD represents an operational voltage value of the equalization device;

VPP represents the first high voltage level;

VBB represents the first low voltage level;

Vt represents a threshold voltage of the equalization device; and

Vr represents a reliability voltage value of the equalization device, Vr varying depending on a gate oxide thickness of the equalization device.

14. The circuit of claim 13, further comprising a pre-charge device configured to pre-charge the pair of data lines responsive to the first control signal.

15. The circuit of claim 13, wherein the equalization device comprises a transistor coupled between the pair of data lines, the transistor comprising a gate terminal configured to receive the first control signal.

* * * * *